(12) United States Patent
Aoyama et al.

(10) Patent No.: US 9,343,844 B2
(45) Date of Patent: May 17, 2016

(54) ELECTRONIC COMPONENT

(71) Applicant: Murata Manufacturing Co., Ltd., Nagaokakyo-shi, Kyoto-fu (JP)

(72) Inventors: Yoshihiro Aoyama, Nagaokakyo (JP); Junya Shimakawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 294 days.

(21) Appl. No.: 13/941,762

(22) Filed: Jul. 15, 2013

(65) Prior Publication Data
US 2013/0301230 A1    Nov. 14, 2013

Related U.S. Application Data

(63) Continuation of application No. PCT/JP2012/000229, filed on Jan. 17, 2012.

(30) Foreign Application Priority Data

Jan. 25, 2011    (JP) .................................. 2011-012561

(51) Int. Cl.
| H05K 1/11 | (2006.01) |
| H05K 3/34 | (2006.01) |
| H01R 13/56 | (2006.01) |
| H01L 23/498 | (2006.01) |

(52) U.S. Cl.
CPC .......... *H01R 13/56* (2013.01); *H01L 23/49838* (2013.01); *H05K 1/112* (2013.01); *H01L 2924/0002* (2013.01); *H05K 3/3436* (2013.01)

(58) Field of Classification Search
CPC ..... H05K 1/112; H05K 1/113; H05K 3/3436; H05K 3/3442; H05K 2201/09481; H05K 2201/094; H01R 13/56
See application file for complete search history.

(56) References Cited

U.S. PATENT DOCUMENTS 6,250,606 B1 *  6/2001  Juso et al. ..................... 257/698
6,803,527 B2 * 10/2004  Dishongh et al. ............. 174/260

(Continued)

FOREIGN PATENT DOCUMENTS

| JP | 08-250844 A | 9/1996 |
| JP | 2002-083900 A | 3/2002 |

(Continued)

OTHER PUBLICATIONS

Official Communication issued in International Patent Application No. PCT/JP2012/000229, mailed on Apr. 17, 2012.
Official Communication issued in corresponding Japanese Patent Application No. 2012-554659, mailed on Feb. 12, 2014.

*Primary Examiner* — Jeremy C Norris
*Assistant Examiner* — Nathan Milakovich
(74) *Attorney, Agent, or Firm* — Keating & Bennett, LLP

(57) ABSTRACT

Based on a result of repeated analysis of stress caused by application of an external impact in a circuit board, which is rectangular or substantially rectangular in plan view and includes mounting electrodes, included in an electronic component, the mounting electrodes near four corners of the circuit board, of the mounting electrodes provided on a back surface of the circuit board included in the electronic component, are provided at positions shifted from diagonal lines of the back surface. Hence, the stress produced near the four corners of the circuit board is reduced, and this can effectively prevent a fracture, a chip, and a crack from being caused in the circuit board.

15 Claims, 6 Drawing Sheets

(56) References Cited

U.S. PATENT DOCUMENTS

| | | | |
|---|---|---|---|
| 7,672,145 B2* | 3/2010 | Shimakawa et al. | 361/816 |
| 7,706,756 B2* | 4/2010 | Sato et al. | 455/78 |
| 2009/0229879 A1* | 9/2009 | Udaka et al. | 174/535 |
| 2010/0032193 A1* | 2/2010 | Lee et al. | 174/260 |
| 2012/0250274 A1* | 10/2012 | Ukita et al. | 361/752 |
| 2014/0055965 A1* | 2/2014 | Kitajima | 361/752 |

FOREIGN PATENT DOCUMENTS

| | | | |
|---|---|---|---|
| JP | 2005-026312 A | | 1/2005 |
| JP | 2007-250675 A | | 9/2007 |
| JP | 2007250675 A | * | 9/2007 |
| JP | 2011-049354 A | | 3/2011 |
| WO | 2009/044737 A1 | | 4/2009 |

* cited by examiner

FIG. 3
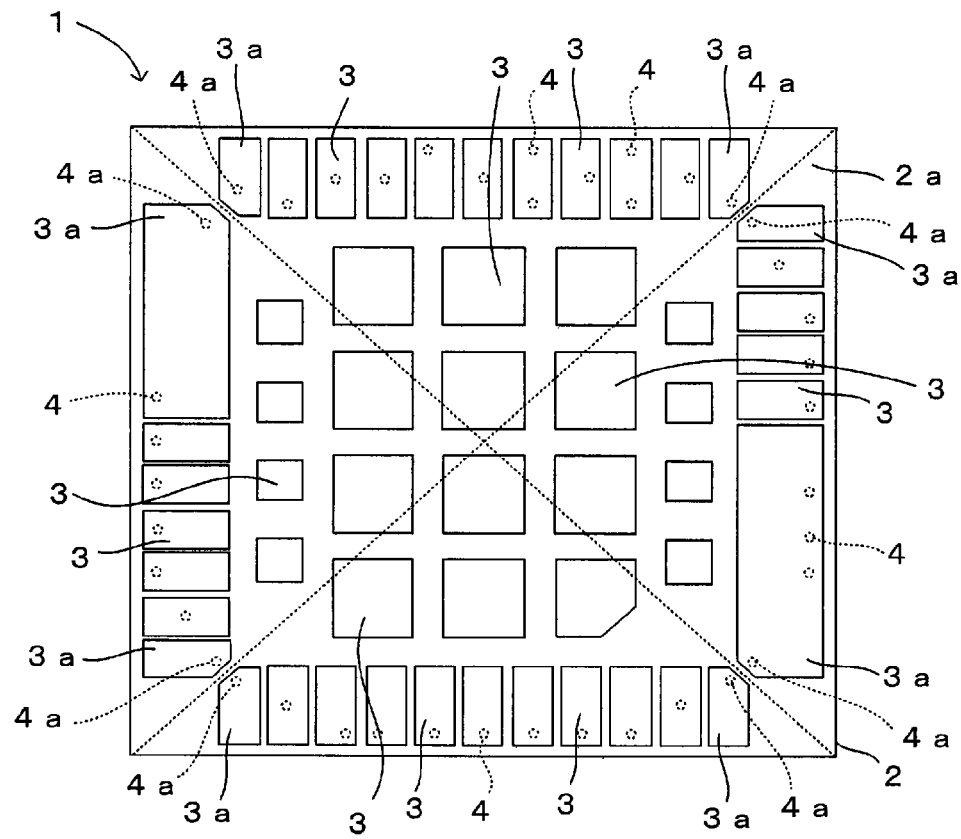
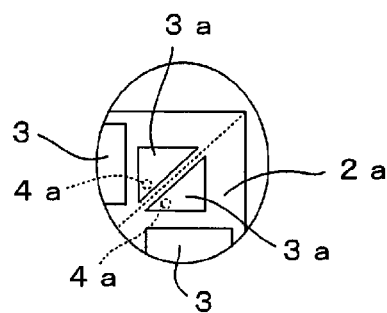
FIG. 4A
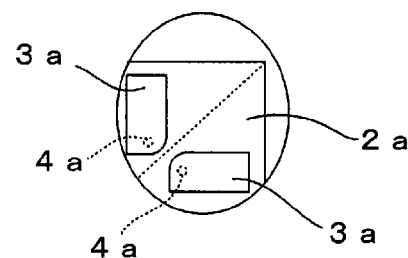
FIG. 4B

ELECTRONIC COMPONENT

BACKGROUND OF THE INVENTION

1. Field of the Invention

The present invention relates to an electronic component including a circuit board which is rectangular or substantially rectangular in plan view and in which a component is mounted on at least one principal surface and a plurality of land-shaped mounting electrodes are provided on the other principal surface.

2. Description of the Related Art

In recent years, there has been a demand to further reduce the size of mobile terminals. Also, there has been a demand to further reduce the size and height of electronic components (electronic radio-frequency modules) mounted on motherboards in the mobile terminals, for example, a Bluetooth (registered trademark) module, a wireless LAN module such as a Wi-Fi module, and an antenna switch module for a cellular phone. Such an electronic component includes a circuit board in which components, for example, a semiconductor element such as a transistor, an FET, a diode and an IC, a resistor element, a capacitor element, and an inductor element are mounted on at least one principal surface, and land-shaped mounting electrodes are provided on the other principal surface. Since there is a demand to reduce the size and height of the electronic component, miniaturization of the circuit board included in the electronic component is advancing, and miniaturization of the mounting electrodes provided on the circuit board is also advancing.

As miniaturization of mounting electrodes provided on a circuit board included in an electronic component thus advances, stress, which results from, for example, a twist given to the circuit board when the electronic component is mounted on a motherboard for assembly of a mobile terminal or an impact applied when the mobile terminal including the motherboard on which the electronic component is mounted with solder falls, concentrates at portions of the circuit board in the electronic component where the mounting electrodes are provided. This may cause a fracture, a chip, and a crack in the circuit board. In this case, transmission lines, such as via holes of the circuit board or a wiring pattern provided in the circuit board, may be broken, and this may result in a breakdown of the mobile terminal.

Accordingly, it has been proposed that corners of four mounting electrodes, which are provided close to four corners of a circuit board, closest to the four corners of the circuit board are cut off and chamfered in order to avoid such a fracture, chip, or crack in the circuit board (see, paragraphs [0001] to [0029] and FIG. 1 of Japanese Unexamined Patent Application Publication No. 2005-26312, for example). That is, as illustrated in FIG. 6, of a plurality of rectangular mounting electrodes 502 provided on a principal surface, which is to be mounted on a motherboard, of a circuit board 501 included in an electronic component 500, four mounting electrodes 502 provided near four corners of the circuit board 501 are chamfered at corners closest to the four corners so that a chamfer amount c becomes a/5 to a/2. This reduces the stress applied to the circuit board 501 by an external impact such as a twist applied to the circuit board 501, and prevents a fracture, a warp, and a crack from being caused in the circuit board 501.

When the corners of the four mounting electrodes 502, which are provided near the four corners of the circuit board 501, closest to the four corners of the circuit board 501, are chamfered, as illustrated in FIG. 6, a fracture, a warp, and a crack are prevented from being caused in the circuit board 501 by an external impact. There is a demand to further improve such a technique.

SUMMARY OF THE INVENTION

Accordingly, preferred embodiments of the present invention provide a technique capable of effectively preventing a fracture, a chip, and a crack from being caused in a circuit board.

An electronic component according to a preferred embodiment of the present invention includes a circuit board which is rectangular or substantially rectangular in plan view and in which a component is mounted on at least one principal surface and a plurality of land-shaped mounting electrodes are provided on the other principal surface. The mounting electrodes near four corners of the circuit board, of the mounting electrodes, are provided at positions shifted from diagonal lines of the other principal surface.

Preferably, the mounting electrodes near the corners are each shaped like a rectangle whose corner closest to the corresponding diagonal line is cut off. According to this structure, stress produced near the four corners of the circuit board is more effectively reduced, and a fracture, a chip, and a crack can be effectively prevented from being caused in the circuit board. Moreover, the density of the mounting electrodes on the other principal surface of the circuit board can be increased.

Preferably, the mounting electrodes near the corners are provided at positions farther from an outer edge of the other principal surface than the other mounting electrodes arranged along the outer edge. According to this structure, the distances between the mounting electrodes near the corners and vertexes of the circuit board are increased, and the stress produced near the corners of the circuit board are further reduced. This can more effectively prevent a fracture, a chip, and a crack from being caused in the circuit board.

Preferably, the electronic component further includes a plurality of through holes for interlayer connection provided in the circuit board, and the through holes connected to the mounting electrodes near the corners, of the through holes, are provided at positions farthest from the corners of the circuit board. According to this structure, the stress produced between the vertexes of the circuit board and the through holes provided near the corners of the circuit board is effectively reduced, and a fracture, a chip, and a crack can be effectively prevented from being caused in the circuit board.

The mounting electrode near at least one of the corners of the circuit board is preferably longer than the other mounting electrodes in a direction of one side adjacent to the mounting electrode near the at least one of the corners. According to this structure, the contact area between a motherboard and the circuit board is increased, and this can increase the mounting strength.

According to various preferred embodiments of the present invention, the mounting electrodes near the four corners of the circuit board, of the mounting electrodes provided on the other principal surface of the circuit board included in the electronic component, are provided at the positions shifted from the diagonal lines of the other principal surface. As a result, the stress produced near the four corners of the circuit board is reduced, and this can effectively prevent a fracture, a chip, and a crack from being caused in the circuit board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a bottom view of an electronic component according to a third preferred embodiment of the present invention.

FIGS. 4A and 4B are enlarged principal views illustrating other examples of mounting electrodes.

DETAILED DESCRIPTION OF THE PREFERRED EMBODIMENTS

First Preferred Embodiment

Figure 1:
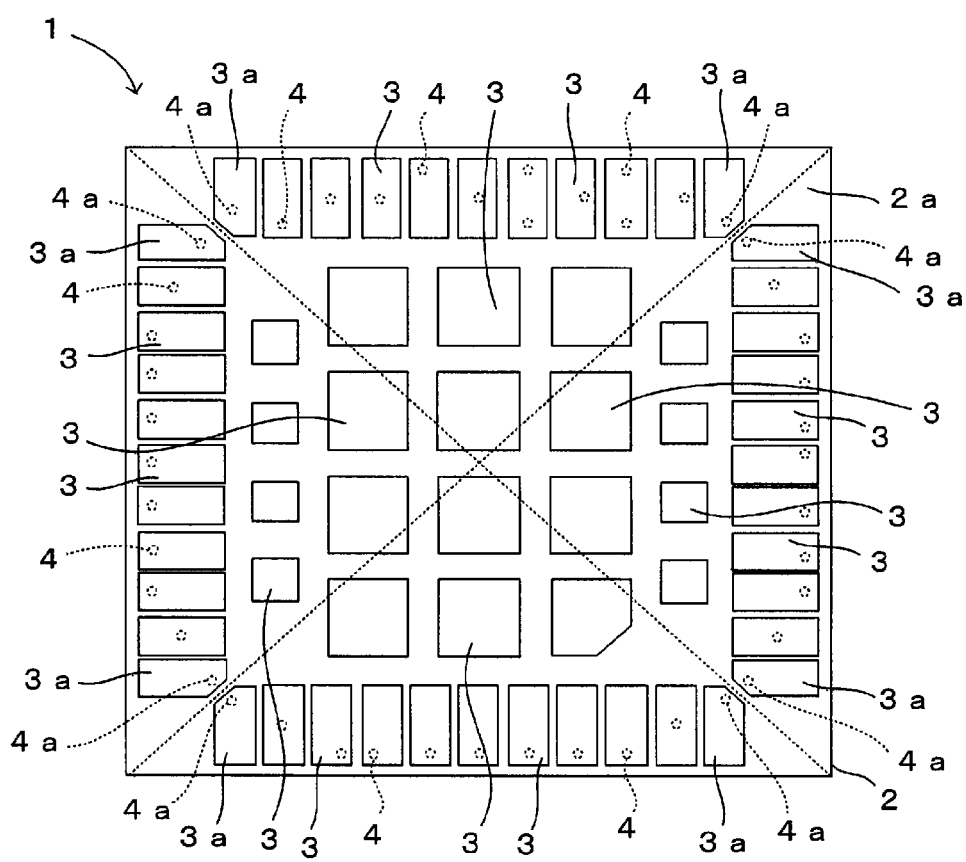
FIG. 1 is a bottom view of an electronic component according to a first preferred embodiment of the present invention.

An electronic component according to a first preferred embodiment of the present invention will be described with reference to FIG. 1. FIG. 1 is a bottom view of the electronic component according to the first preferred embodiment of the present invention.

An electronic component 1 illustrated in FIG. 1 includes a circuit board 2 that preferably is a multilayered ceramic board, in which components, for example, a semiconductor element such as an amplifier, a diode, and a switch including a transistor or an FET, a resistor element, a capacitor element, and an inductor element, are mounted on at least a front surface (one principal surface), and land-shaped surface mounting electrodes 3 and 3a are mounted on a back surface 2a (the other principal surface). The electronic component 1 preferably is a module such as a Bluetooth (registered trademark) module, a wireless LAN module, or an antenna switch module for a cellular phone, for example. The unillustrated front surface of the circuit board 2 on which various components are mounted is entirely molded with a common mold resin, such as epoxy resin, while the various components are mounted thereon. Instead of being molded with the mold resin, the front surface of the circuit board 2 may be covered with a metal case for electromagnetic shielding.

The circuit board 2 is formed preferably by firing a laminated body of ceramic green sheets. A ceramic green sheet that defines each layer in the circuit board 2 is obtained preferably by shaping, into a sheet, slurry in which mixed powder of alumina, glass, etc. is mixed together with an organic binder and solvent, by a film deposition apparatus, and can be subjected to so-called low-temperature firing at a low temperature of about 1000° C., for example. Each layer is formed preferably by conducting via formation and various pattern printing with a conductive paste of Ag or Cu, on the ceramic green sheet cut in a predetermined shape.

That is, first, via holes are formed in a green sheet having a predetermined shape by a laser or the like, and are filled with a conductive paste, whereby via holes 4 and 4a (via conductors, corresponding to "through holes") for interlayer connection are formed. A predetermined wiring pattern including mounting electrodes 3 and 3a is printed with a conductive paste of Cu or Ag, and a plurality of green sheets are prepared to form layers that constitute the circuit board 2. On each of the green sheets, a plurality of wiring patterns are provided so that a lot of circuit boards 2 can be formed at a time.

Next, the layers are stacked to form a laminated body. Then, grooves along which the laminated body is divided into individual circuit boards 2 after firing are formed to surround areas of the individual circuit boards 2. Subsequently, the laminated body is fired under pressure to form an assembly of circuit boards 2.

Before the assembly is divided into the individual circuit boards 2, the mounting electrodes 3 and 3a provided on back surfaces 2a are plated with Ni and Au. The assembly is then divided into the individual circuit boards 2 such that each circuit board 2 is completed.

Next, a description will be given of the mounting electrodes 3 and 3a provided on the back surface 2a of each circuit board 2. The mounting electrodes 3a near four corners of the circuit board 2, of the mounting electrodes 3 and 3a provided on the back surface 2a of the circuit board 2, are provided at positions shifted from diagonal lines of the back surface 2a shown by dotted lines in FIG. 1. The mounting electrodes 3a near the corners are each shaped like a rectangle whose corner closest to the corresponding diagonal line of the back surface 2a is cut off.

The mounting electrodes 3 and 3a provided on the back surface 2a of the circuit board 2 are electrically connected to various components mounted on the front surface via the via holes 4 and 4a (some of them are not illustrated) and a wiring pattern provided in the circuit board 2. The via holes 4a connected to the mounting electrodes 3a near the corners 3a, of the via holes 4 and 4a, are provided at positions farthest from the corners of the circuit board 2.

Repeated analysis was conducted on stress produced by the application of an external impact in the circuit board 2 included in the electronic component 1 of the above-described preferred embodiment, in which the circuit board 2 was rectangular in plan view and had components mounted on at least the front surface and a plurality of land-shaped mounting electrodes 3 and 3a provided on the back surface 2a. As a result of the analysis, it was discovered that a great stress resulting in a fracture, a chip, and a crack of the circuit board was frequently produced when the mounting electrodes 3a were provided on the diagonal lines near the four corners of the circuit board 2.

Accordingly, the mounting electrodes 3a near the four corners of the circuit board 2, of the mounting electrodes 3 and 3a provided on the back surface 2a of the circuit board 2 included in the electronic component 1, are provided at the positions shifted from the diagonal lines of the back surface 2a. Hence, the stress produced near the four corners of the circuit board 2 is reduced, and this can effectively prevent a fracture, a chip, and a crack from being caused in the circuit board 2.

As the result of analysis of the stress produced by the application of external impact, it was also discovered that great stress was produced between vertexes of the rectangular mounting electrodes 3a near the corners of the circuit board 2, which had an acute angle or a right angle and were provided closest to the diagonal lines of the back surface 2a of the circuit board 2, and the vertexes of the circuit board 2. Accordingly, the mounting electrodes 3a near the corners are each shaped like a rectangle whose corner closest to the corresponding diagonal line of the back surface 2a of the circuit board 2 is cut off. As a result, the stress produced near the four corners of the circuit board 2 is more effectively reduced, and this can effectively prevent a fracture, a chip, and a crack from being caused in the circuit board 2.

By locating the mounting electrodes 3a, which are each shaped like a rectangle whose corner is cut off, such that the cut portion is closer to the corresponding diagonal line of the circuit board 2, the number of mounting electrodes 3 and 3a can be increased and the density of the mounting electrodes 3 and 3a can be increased on the back surface 2a of the circuit board 2 without wasting the space on the back surface 2a of the circuit board 2.

Since a plurality of via holes 4 and 4a for interlayer connection are further provided in the circuit board 2, the mechanical strength of the circuit board 2 decreases, and a fracture, a chip, and a crack may be caused in the circuit board 2 by the stress produced near the via holes 4a provided near the corners when an external impact is applied. However, since the via holes 4a connected to the mounting electrodes 3a near the corners, of the via holes 4 and 4a, are located at the positions farthest from the corners of the circuit board 2, the stress produced between the vertexes of the circuit board 2 and the via holes 4a provided near the corners of the circuit board 2 is effectively reduced, and this can effectively prevent a fracture, a chip, and a crack from being caused in the circuit board 2.

Second Preferred Embodiment

Figure 2:
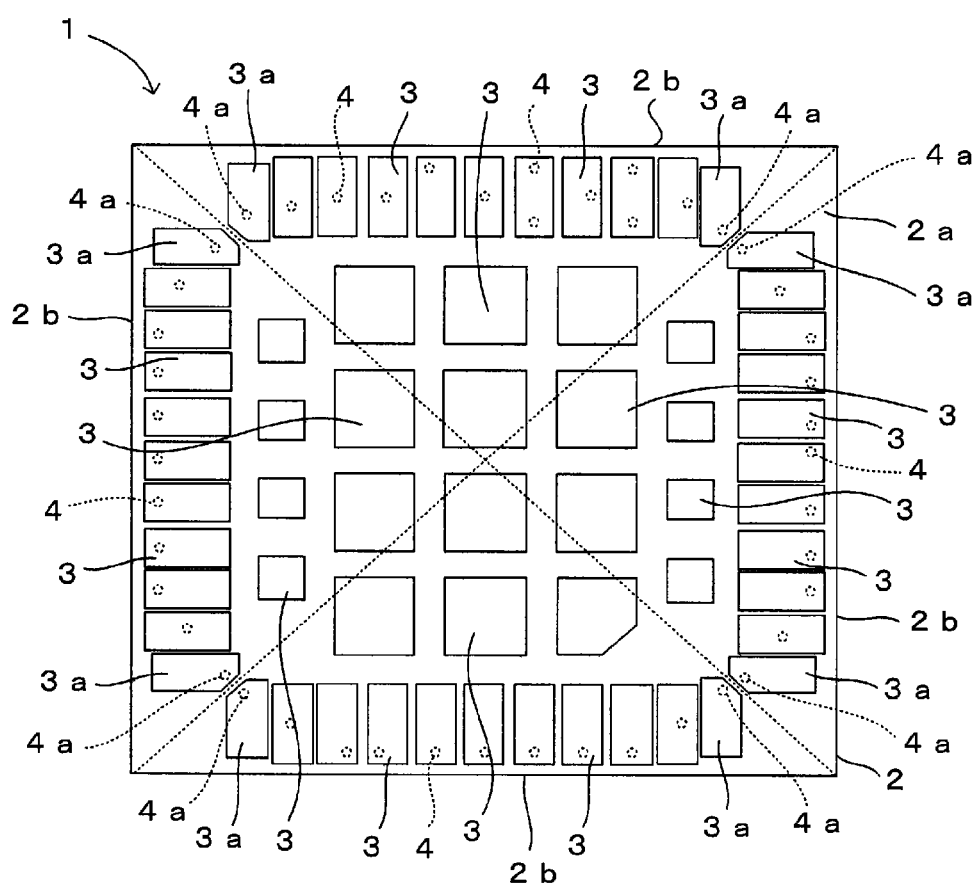
FIG. 2 is a bottom view of an electronic component according to a second preferred embodiment of the present invention.

An electronic component according to a second preferred embodiment of the present invention will be described with reference to FIG. 2. FIG. 2 is a bottom view of the electronic component according to the second preferred embodiment of the present invention.

This preferred embodiment is different from the above-described first preferred embodiment in that, as illustrated in FIG. 2, mounting electrodes 3a near the corners are provided at positions farther from an outer edge 2b of a back surface 2a of a circuit board 2 than other mounting electrodes 3 arranged along the outer edge 2b, that is, at positions closer to the center of the back surface 2a. Since other structures are similar to those adopted in the above-described first preferred embodiment, they are denoted by the same reference numerals, and descriptions thereof are skipped.

According to this preferred embodiment, since the mounting electrodes 3a near the corners of the circuit board 2 are provided at the positions farther from the outer edge 2b of the back surface 2a of the circuit board 2 than the other mounting electrodes 3 arranged along the outer edge 2b, the distances between the mounting electrodes 3a near the corners and the vertexes of the circuit board 2 increase. This further reduces the stress produced near the corners of the circuit board 2, and can more effectively prevent a fracture, a chip, and a crack from being caused in the circuit board 2.

Third Preferred Embodiment

An electronic component according to a third preferred embodiment of the present invention will be described with reference to FIG. 3. FIG. 3 is a bottom view of the electronic component according to the third preferred embodiment of the present invention.

This preferred embodiment is different from the above-described first preferred embodiment in that, as illustrated in FIG. 3, a mounting electrode 3a near at least one corner is longer than other mounting electrodes 3 in a direction of one side of the circuit board 2 adjacent to the mounting electrode 3a near the corner. Since other structures are similar to those adopted in the above-described first preferred embodiment, they are denoted by the same reference numerals, and descriptions thereof are skipped.

According to this preferred embodiment, the mounting electrode 3a near at least one corner is longer than the other mounting electrodes 3 in the direction of one side of the circuit board 2 adjacent to the mounting electrode 3a near the corner. Hence, the contact area between a motherboard on which the electronic component 1 is mounted, and the circuit board 2 increases, and this can increase the mounting strength.

For example, when mold resin that molds a front surface of the circuit board 2 contracts, the circuit board 2 is sometimes warped because of unevenness of density of a wiring pattern in the circuit board 2. However, by adjusting the length of the mounting electrode 3a in the direction of one side of the circuit board 2 according to the density of the wiring pattern in the circuit board 2, contraction of the circuit board 2 can be significantly reduced or prevented, and the circuit board 2 can be prevented from warping.

The mounting electrodes 3 other than the mounting electrode 3a near the corner may be longer in the direction of one adjacent side of the circuit board 2.

The present invention is not limited to the above-described preferred embodiments, and various modifications other than the above can be made without departing from the scope of the present invention. While the circuit board 2 preferably is defined by a multilayered ceramic substrate in the above-described preferred embodiments, it may be defined by a multilayered substrate of resin such as epoxy resin or a liquid crystal polymer, or may be defined by a single-layer substrate such as an alumina substrate, for example.

While the mounting electrodes 3a near the corners of the circuit board 2 are each preferably shaped like a rectangle having a portion cut off in a linear form in the above-described preferred embodiments, a portion of the rectangle may be largely cut off so that each of the mounting electrodes 3a becomes triangular, as illustrated in FIG. 4A, or a portion of the rectangle may be cut off in a curved form, as illustrated in FIG. 4B. FIGS. 4A and 4B are enlarged principal views illustrating other examples of mounting electrodes, FIG. 4A illustrates an example of a mounting electrode whose portion is largely cut off in a linear form, and FIG. 4B illustrates an example of a mounting electrode having a portion that is cut off in a curved form.

Figure 7:
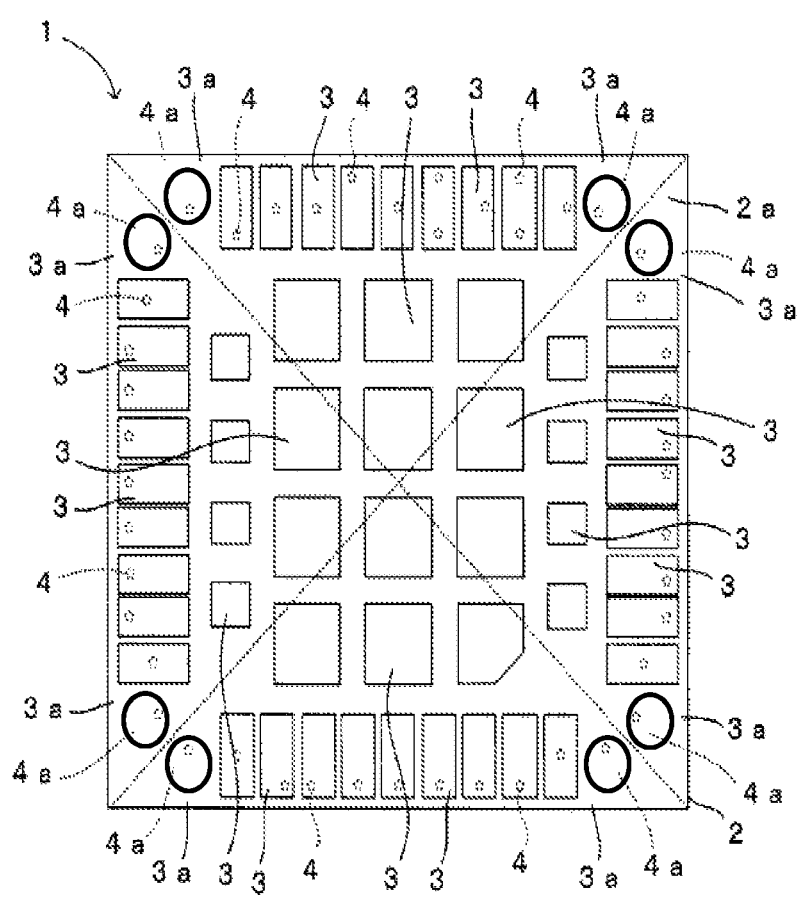
FIG. 7 is a bottom view of an electronic component according to a modified example of the first preferred embodiment of the present invention.
Figure 8:
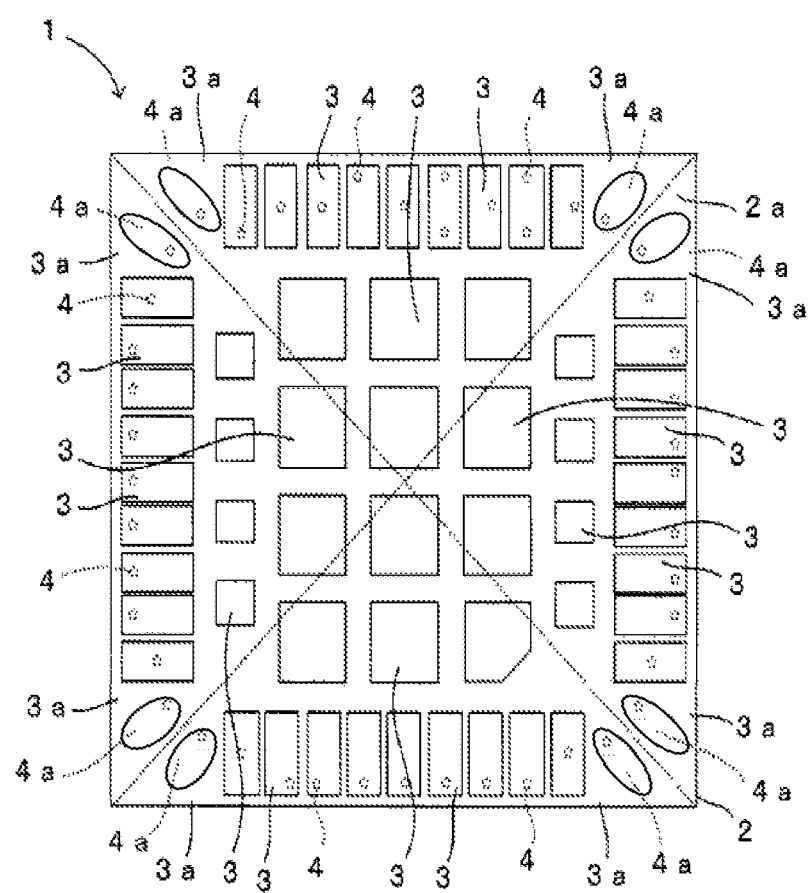
FIG. 8 is a bottom view of an electronic component according to another modified example of the first preferred embodiment of the present invention.

While the mounting electrodes 3a near the corners of the circuit board 2 preferably are each shaped like a rectangle having a portion that is cut off in the above-described preferred embodiments, the shape of the mounting electrodes 3a is not limited to the above shape, and may be any shape, for example, a circular or substantially circular shape or an elliptical or substantially elliptical shape as shown in FIGS. 7 and 8.

Figure 5A:
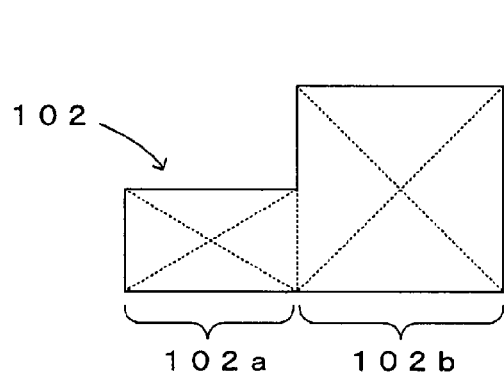
FIGS. 5A and 5B are views illustrating other examples of electronic components according to various preferred embodiments of the present invention.
Figure 5B:
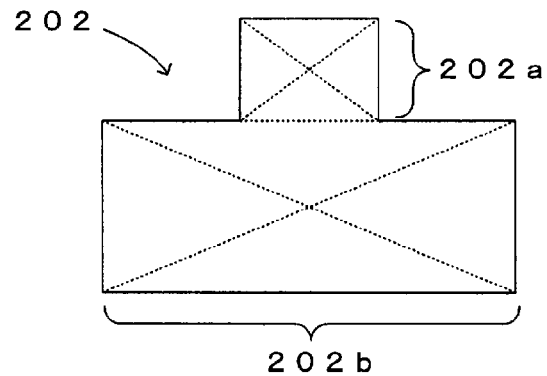
Figure 6:
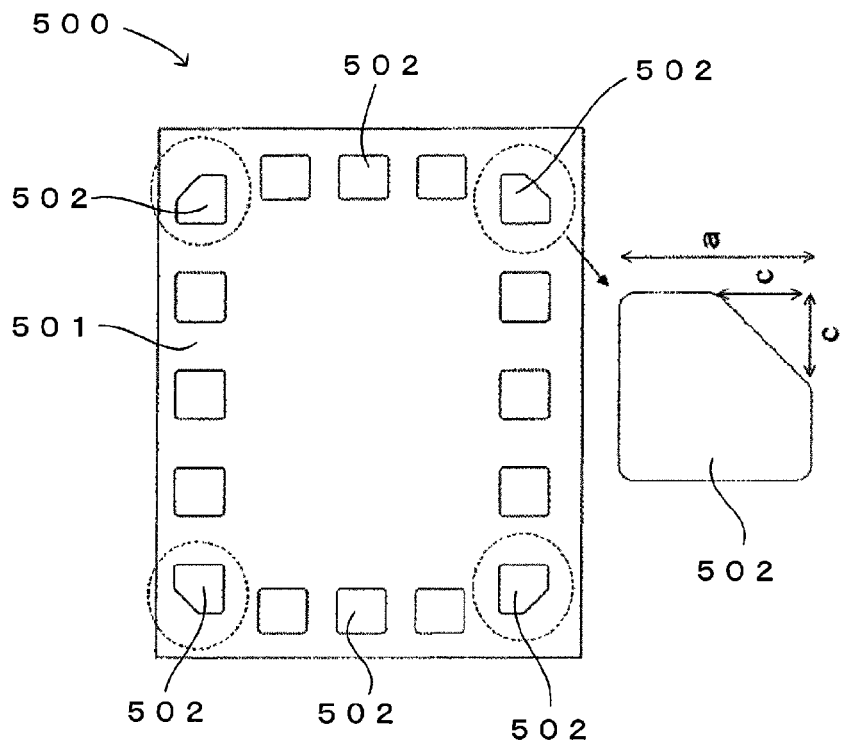
FIG. 6 is a bottom view of an example of a circuit board of the related art.

While the circuit board 2 preferably is rectangular or substantially rectangular in the above-described preferred embodiments, the present invention is also applicable to polygonal circuit boards 102 and 202 illustrated in FIGS. 5A and 5B as long as the circuit board 102 is divided into two rectangular or substantially rectangular areas 102a and 102b, the circuit board 202 is divided into two areas 202a and 202b, and mounting electrodes near the corners are provided at positions shifted from diagonal lines of the areas 102a, 102b, 202a, and 202b (dotted lines in the figures). FIGS. 5A and 5B illustrate other examples of electronic components according to various preferred embodiments of the present invention, and illustrate examples of circuit boards.

The positions of the via holes 4a connected to the mounting electrodes 3a near the corners are not limited to the above-described examples. It is satisfactory as long as the via holes 4a are provided at adequate positions as far from the corners of the circuit board 2 as possible, for example, according to the shape or size of the mounting electrodes 3a or the wiring pattern in the circuit board 2.

Preferred embodiments of the present invention can be applied to various electronic components each including a circuit board which is rectangular or substantially rectangular in plan view and in which components are mounted on at least one principal surface and a plurality of land-shaped mounting electrodes are provided on the other principal surface.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a circuit board which is rectangular or substantially rectangular in plan view and in which a component is mounted on at least a first principal surface and a plurality of land-shaped mounting electrodes are provided on a second principal surface; and
   a plurality of through holes for interlayer connection provided in the circuit board and connected to respective ones of the plurality of mounting electrodes; wherein
   mounting electrodes near four corners of the circuit board of the plurality of mounting electrodes are provided at positions shifted from diagonal lines of the second principal surface;
   the through holes connected to the mounting electrodes near the four corners of the circuit board are disposed at positions farther from an outer peripheral edge of the circuit board than the through holes connected to mounting electrodes of the plurality of mounting disposed farther from the four corners of the circuit board than the mounting electrodes near the four corners of the circuit board.

2. The electronic component according to claim 1, wherein the mounting electrodes near the corners are each shaped like a rectangle whose corner closest to the corresponding diagonal line is cut off.

3. The electronic component according to claim 1, wherein the mounting electrodes near the corners are provided at positions farther from an outer edge of the second principal surface than the other mounting electrodes arranged along the outer edge.

4. The electronic component according to claim 1, wherein the through holes connected to the mounting electrodes near the corners are disposed at positions farthest from the corners of the circuit board.

5. The electronic component according to claim 1, wherein the mounting electrode near at least one of the corners of the circuit board is longer than the other mounting electrodes in a direction of one side of the circuit board adjacent to the mounting electrode near the at least one of the corners.

6. The electronic component according to claim 1, wherein the circuit board is a multilayered ceramic board.

7. The electronic component according to claim 1, wherein the component is one of a semiconductor element, an amplifier, a diode, a switch including a transistor or an FET, a resistor element, a capacitor element, and an inductor element.

8. The electronic component according to claim 1, further comprising a plurality of the component mounted on at least the first principal surface.

9. The electronic component according to claim 8, wherein the components include one of a semiconductor element, an amplifier, a diode, a switch including a transistor or an FET, a resistor element, a capacitor element, and an inductor element.

10. The electronic component according to claim 1, wherein the electronic component is one of a wireless module and an antenna switch module.

11. The electronic component according to claim 1, further comprising a metal case or molded resin container arranged to contain the circuit board.

12. The electronic component according to claim 1, wherein the circuit board includes a plurality of ceramic layers.

13. The electronic component according to claim 1, wherein the circuit board is a multilayered substrate made of resin.

14. The electronic component according to claim 1, wherein the circuit board is a single-layer substrate.

15. The electronic component according to claim 1, wherein the mounting electrodes near the corners are circular or substantially circular or elliptical or substantially elliptical.

* * * * *